United States Patent
Hartmann

(10) Patent No.: US 9,374,914 B2
(45) Date of Patent: Jun. 21, 2016

(54) AIR GUIDANCE UNIT

(75) Inventor: Reiner Hartmann, Wettenberg (DE)

(73) Assignee: Rittal GmbH & Co. KG, Herborn (DE)

( * ) Notice: Subject to any disclaimer, the term of this patent is extended or adjusted under 35 U.S.C. 154(b) by 21 days.

(21) Appl. No.: 13/261,482

(22) PCT Filed: Mar. 15, 2011

(86) PCT No.: PCT/EP2011/053891
§ 371 (c)(1),
(2), (4) Date: Feb. 4, 2013

(87) PCT Pub. No.: WO2011/131423
PCT Pub. Date: Oct. 27, 2011

(65) Prior Publication Data
US 2013/0130608 A1 May 23, 2013

(30) Foreign Application Priority Data
Apr. 19, 2010 (DE) .......................... 10 2010 016 503

(51) Int. Cl.
*H05K 5/00* (2006.01)
*F04D 29/54* (2006.01)
*F04D 29/60* (2006.01)
*H05K 7/20* (2006.01)

(52) U.S. Cl.
CPC ............... *H05K 5/00* (2013.01); *F04D 29/545* (2013.01); *F04D 29/601* (2013.01); *H05K 7/20172* (2013.01); *H05K 7/20181* (2013.01); *B01D 2273/30* (2013.01)

(58) Field of Classification Search
CPC ..... F04D 29/545; F04D 29/60; F04D 29/601; F04D 29/602; H05K 5/00; H05K 7/20136; H05K 7/20172; H05K 7/20181; B01D 2273/30

USPC ......... 454/184, 251, 266, 304, 338, 341, 363; 415/121.2
See application file for complete search history.

(56) References Cited

U.S. PATENT DOCUMENTS

| | | | |
|---|---|---|---|
| 2,619,021 A * | 11/1952 | Pfautsch | 454/292 |
| 4,662,822 A | 5/1987 | Foeldesi et al. | |
| 5,117,656 A | 6/1992 | Keck et al. | |
| 5,192,183 A * | 3/1993 | Wilkinson | 415/90 |
| 6,071,078 A | 6/2000 | Schlegel et al. | |
| 6,186,889 B1 * | 2/2001 | Byrne | 454/184 |
| 6,549,406 B1 * | 4/2003 | Olesiewicz et al. | 361/695 |
| 6,616,525 B1 * | 9/2003 | Giraldo et al. | 454/184 |

(Continued)

FOREIGN PATENT DOCUMENTS

| | | |
|---|---|---|
| DE | 35 032 20 C1 | 7/1986 |
| DE | 10 2004 005 028 A1 | 9/2005 |

(Continued)

*Primary Examiner* — Gregory Huson
*Assistant Examiner* — Dana Tighe
(74) *Attorney, Agent, or Firm* — Marshall & Melhorn, LLC

(57) ABSTRACT

The invention relates to an air guidance unit comprising an air guidance housing and a fan assembly that can be detachably connected thereto. In order to allow an efficient and time-saving maintenance of such an air guidance unit, it is provided according to the invention that the air guidance housing comprises one or more blocking studs, that the fan assembly comprises closure receptions each having a blocking section into which the blocking stud can be swiveled, and that a detachable locking piece immobilizes the fan assembly in the mounting position of the fan assembly.

12 Claims, 2 Drawing Sheets

(56) References Cited

U.S. PATENT DOCUMENTS

| | | | |
|---|---|---|---|
| 7,362,578 B2 * | 4/2008 | Hornung | 361/704 |
| 7,411,788 B2 | 8/2008 | Liang | |
| 2003/0095866 A1 * | 5/2003 | Chuang | 415/176 |
| 2006/0292010 A1 * | 12/2006 | Holston et al. | 416/244 R |
| 2008/0121107 A1 | 5/2008 | Pfannenberg | |
| 2010/0300648 A1 | 12/2010 | Grantham | |
| 2011/0150632 A1 | 6/2011 | Heli et al. | |

FOREIGN PATENT DOCUMENTS

| | | |
|---|---|---|
| DE | 20 2006 015 789 U1 | 12/2006 |
| EP | 0 242 342 A1 | 10/1987 |
| EP | 2 338 581 A1 | 6/2011 |
| GB | 2 066 362 A | 7/1981 |
| WO | WO 2007/090804 A2 | 8/2007 |
| WO | WO 2010/138327 A1 | 12/2010 |

* cited by examiner

AIR GUIDANCE UNIT

BACKGROUND OF THE INVENTION

The invention relates to an air guidance unit for mounting into a cut-out of a switch-gear cabinet wall, comprising an air guidance housing and a fan assembly that can be detachably connected thereto, the air guidance housing comprising one or more blocking studs, the fan assembly comprising closure receptions each having a block-inq section into which the blocking stud can be swiveled, a detachable locking piece immobilizing the fan assembly in the mounting position of the fan assembly, wherein the fan assembly comprises two fixing sides, the fixing sides comprising the closure receptions with blockings section and wherein the fan assembly can be selectively fixed at the air guidance housing by means of the fixing sides in operating positions rotated by 180 degrees. In a maintenance situation, merely the locking piece must be unlocked. Then, the fan assembly can be swiveled away from the blocking stud and can be removed. A new fan assembly can then be quickly and simply replaced in a reversed assembly sequence. Such an air guidance unit is known from WO 2007/090804 A2. Other air guidance units are known from U.S. Pat. No. 5,117,656 A, EP 0 242 342 A1, US 2008/037216 A1 and DE 20 2006 015 789 U1.

Air guidance units of this type are, for example, used in switchgear cabinet construction. The air guidance housing is installed in a cut-out of a switchgear cabinet wall. The fan assembly generally includes an electric motor and a fan which sucks ambient air, conveys it through the air guidance housing and blows it into the interior of the switchgear cabinet. In an alternative construction variant, the air conveying direction is reversed, where air is sucked from the interior of the switchgear cabinet and is blown out to the ambient through the air guidance housing. In a maintenance situation, the defective fan assembly is separated from the air guidance housing and is replaced by a new one.

SUMMARY OF THE INVENTION

It is the object of the invention to provide an air guidance unit of the type mentioned in the introductory, where exchange of the fan assembly can be performed easily and low time consuming to reduce downtime, and which may simultaneously be converted from sucking to blowing operation (or vice versa) in a simple way.

The air guidance unit according to the invention may be easily converted from sucking to blowing operation (or vice versa) in that the fan assembly comprises a housing having two flanges which are equipped with the closure reception. The fan assembly, depending on a desired operation mode, sucking or blowing, is seated with the respective flange at its rear side on a bottom of the air guidance housing.

According to a preferred variant of embodiment of the invention, it may be provided that the fan assembly comprises a power connection that the fan assembly can be fixed at the air guidance housing in several mounting positions and that the power connection is oriented in different allocations to the air guidance housing in different mounting positions. Thus, the locking mechanism between the fan assembly and the air guidance housing allows an individual orientation of the power connection with respect to the installation conditions within the switchgear cabinet.

An air guidance unit according to the invention may be characterized in that the fan assembly comprises a circular flange which is inserted into a circular passage of the air guidance housing and centered therein and that the flange can be rotated in the passage to swivel the blocking stud into the blocking section. Allocation of the circular flange and the passage forms some type of bearing which guides the swivel motion of the fan assembly. Accordingly, even under confined or unclear installation conditions, a target-oriented and simple assembly is always possible.

Toolless mounting of the fan assembly at the air guidance housing is achieved in a simple manner if it is provided that the locking piece can be deflected against the biasing force of a spring when swiveling the fan assembly and that the locking piece snaps into a snap-lock for locking the fan assembly in the mounting position.

To release the fan assembly, the locking piece is simply deflected against the spring biasing force, so that it disengages from the snap-lock. Thus, the fan assembly is released and can be swiveled away.

Actuation of the locking piece is in particular simplified in that it can be moved, in the mounting position of the fan assembly, from its locking position into a release position by means of a release piece.

A preferred variant of the invention is such that the air guidance housing comprises a continuous housing wall which is integrally connected with a bottom, that the bottom comprises the passage for air delivered by the fan assembly and that in the region of the housing wall at the outside thereof snap elements are provided for locking the air guidance housing in an opening of a wall element of the switchgear cabinet. Toolless fixing of the air guidance unit at the switchgear cabinet can be achieved by means of the snap elements. Alternatively or in addition thereto, if desired, screwing of the air guidance unit with the wall element of the switchgear cabinet may be provided.

A preferred air guidance unit is characterized in that the air guidance housing carries hinge parts at a front side thereof to which an air passage grating is pivotally hinged and that the air passage grating can be swiveled between a mounting and a maintenance position, wherein it covers an air passage portion of the air guidance housing at the front thereof in the mounting position.

If it is provided that the blocking stud is shaped like a knob and has a shaft carrying a head at a free end thereof and that the blocking section is formed as a slit-shaped receptacle receiving the shaft and being overlapped by the head, a stable fixing of the fan assembly is possible with minimum construction effort.

BRIEF DESCRIPTION OF THE DRAWINGS

The invention will be explained further below with the aid of an exemplary embodiment illustrated in the drawings.

It is shown in.

DETAILED DESCRIPTION OF THE INVENTION

Figure 1:
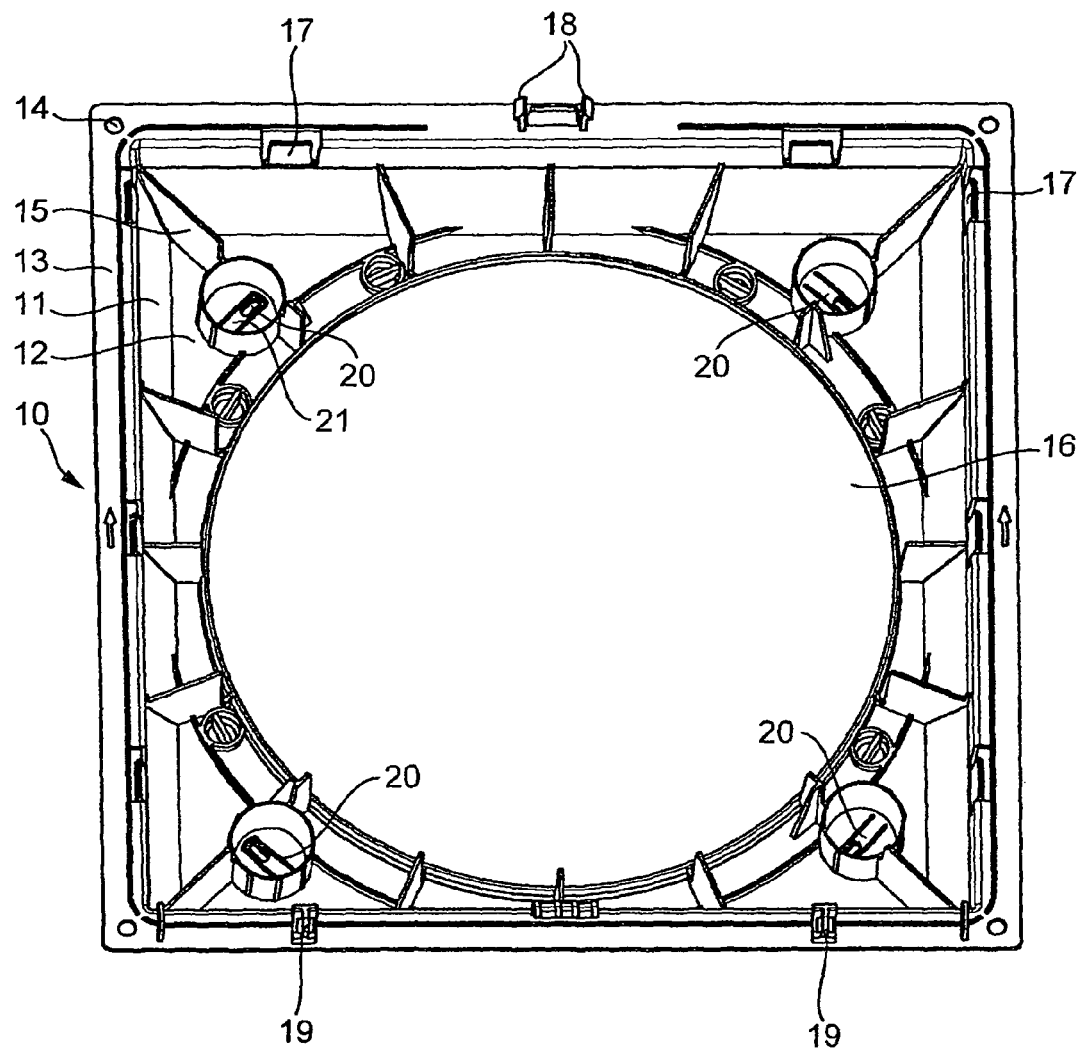
FIG. 1 an air guidance housing of an air guidance unit in a perspective front view, FIG. 2 the air guidance housing of FIG. 1 in a rear view as an exploded view as well as a fan assembly.

FIG. 1 shows an air guidance housing 10 comprising a continuous housing wall 11. Housing wall 11 merges into a bottom 12 which is penetrated by a circular passage 16. Bottom 12 is coupled to housing wall 11 by means of ledges 15 owing to stability reasons. Housing wall 11 terminates in a continuous flange 13, facing away from bottom 12, which flange extends radially outward. Screw receptacles 14 are incorporated into corner regions of flange 13. At a lower horizontal rim of flange 13, two hinge parts 19 are formed thereto. To these hinge parts 19, an air guidance grating, not illustrated in the drawings, can be hinged. The air guidance grating can be folded down around a horizontal pivot axis. In the mounting position, the air guidance grating can be fixed to a locking 18 which is arranged in the upper region of flange 13.

The construction unit shown in FIG. 1 is integrally formed as a plastic injection molded part.

Blocking elements 20 are arranged in corner regions of air guidance housing 10 which are exposed from bottom 12 in form of tongues. Blocking elements 20 are integrally formed to bottom 12 via a coupling piece which is embodied as a spring 21. Spring 21 carries a locking piece 22 at its free end as shown in further detail in FIG. 2. As apparent from this illustration, locking piece 22 is formed as a thickened tab which rearwardly protrudes from bottom 12. Further, locking studs 23 protrude from the rear of bottom 12. In the circular illustration in FIG. 2, the embodiment of blocking stud 23 is shown in further detail, wherein the upper detailed illustration within the circle illustrates a full cut of the blocking stud 23 and the lower illustration a top view of blocking stud 23. As may be recognized from these drawings, blocking stud 23 comprises a shaft 23.2 which is integrally formed to bottom 12. At the end of shaft 23.3 facing away from bottom 12, blocking stud 23 comprises a thickened head 23.1. For purposes of deforming, bottom 12 is exposed by an opening below head 23.1.

Figure 2:
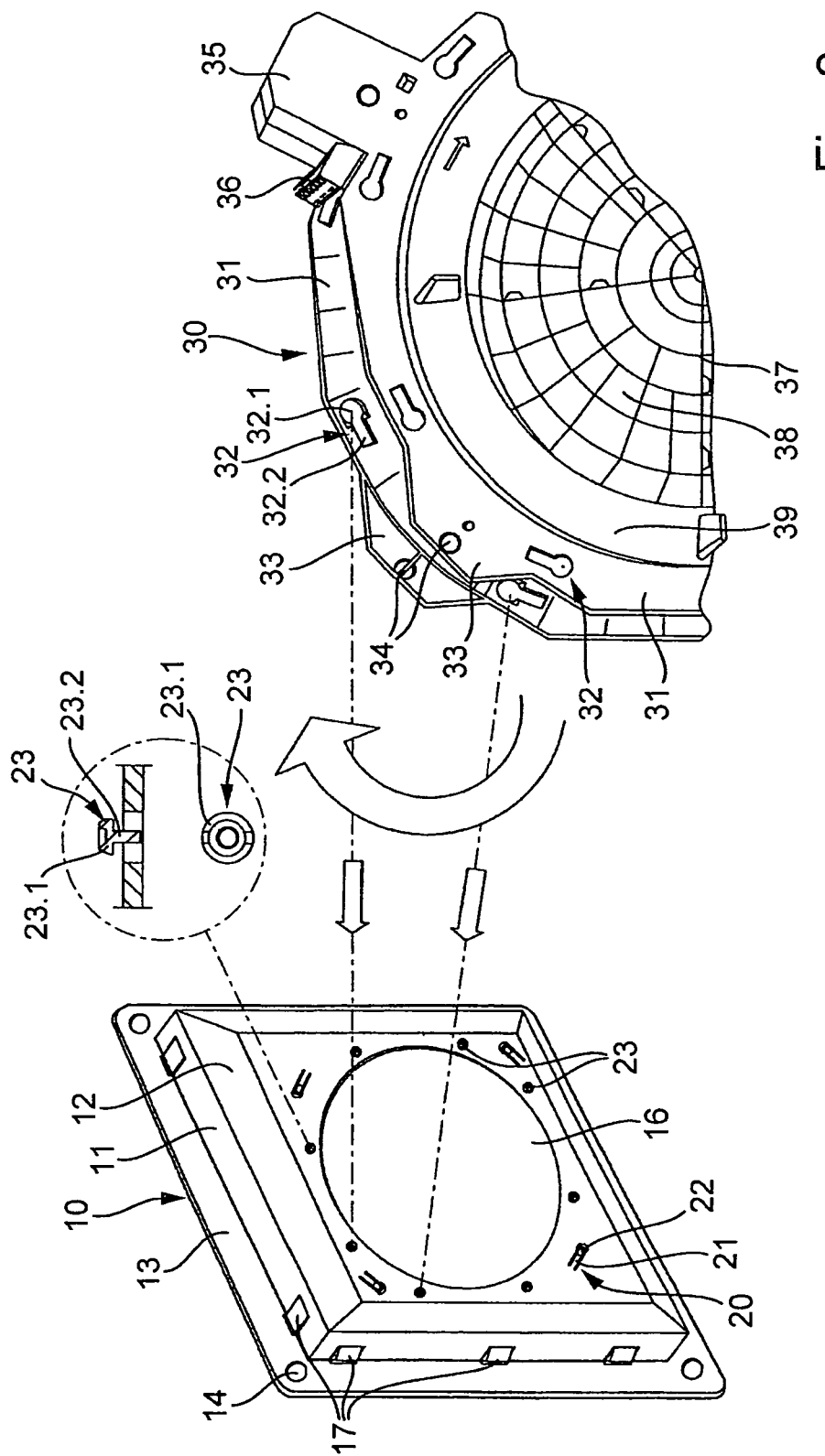

It may further be recognized from FIG. 2 that housing wall 11 of air guidance housing 10 carries outwardly protruding snap elements 17. With the aid of these snap elements 17, air guidance housing 10 can be locked in an opening of a switchgear cabinet wall and fixed thereby. Additionally, air guidance housing 10 can further be screwed with the wall element of the switchgear cabinet via screw receptacles 14.

A fan assembly 30 can be attached to air guidance housing 10 mounted on the switchgear cabinet side. Fan assembly 30 comprises an incorporated electric motor and a fan 38. The electromotor is supplied with current or controlled via a lateral power connector 35 having a connecting terminal 36. Fan 38 is protected against contact by means of a grating 37. Grating 37 is inserted into a circular flange 39. Fan assembly 30 includes a housing comprising two flanges 31. Flanges 31 are equipped with keyhole-shaped closure receptions 32. Closure receptions 32 comprise a circular reception 32.1 merging into a slit-shaped blocking section 32.2. Both flanges 31 are respectively provided with identical closure receptions 32 at opposite sides, however, closure receptions 32 being positioned mirror-inverted. Further, tabs 33 are formed to flanges 31 which include a manually operable release part 34. Release part 34 is integrally formed to flange 31 via a spring section and can be deflected in relation to flange 31 and perpendicular to the flange plane against the spring biasing force. For mounting fan assembly 30, it is, depending on the desired operation mode (sucking or blowing operation) seated rearwardly to bottom 12 of air guidance housing 10 with a respective one of flanges 31. Heads 23.1 of blockings studs 23 penetrate through receptions 32:1 of closure receptions 32. Linear arrows illustrated in FIG. 2 symbolize the seating movement. Subsequently, as illustrated by the arc-shaped arrow representation in FIG. 2, fan assembly 30 is rotated clockwise. While doing this, fan assembly 30 is pushed with its blocking sections 32.2 across shaft 23.2 of blocking studs 23. Heads 23.1 of blockings studs 23 thus prevent that fan assembly 30 can be removed perpendicular to bottom 12. During swiveling motion, blocking elements 20 slide on facing sides of tab 33 and are deflected spring-elastically. As soon as locking pieces 22 of blocking elements 20 are aligned with release parts 34, they snap into receptions of tab 31 which are arranged below release parts 34. In this way, fan assembly 30 is then fixed to air guidance housing 10, so that it cannot turn. When rotating fan assembly 30 with respect to air guidance housing 10, flange 39 engages passage 16. Outer diameter of flange 39 is fitted to the inner diameter of passage 16, so that a swivel bearing is formed which guides the swivel movement.

For dismounting fan assembly 30, release parts 34 are deflected against the spring biasing force and pressed onto locking pieces 22. Release parts 34 may be easily operated manually. When pressing on the locking pieces 22, they are deflected from the receptions and thus release fan assembly 30. Subsequently, fan assembly 30 can be rotated counter-clockwise so that blocking studs 23 reach the region of receptions 32.1. Then, fan assembly 30 may be removed perpendicular to bottom 12 of air guidance housing 10 and, if needed, replaced by a new fan assembly 30.

The invention claimed is:

1. An air guidance unit for mounting into a cut-out of a switchgear cabinet wall, comprising an air guidance housing and a fan assembly that can be detachably connected thereto, the air guidance housing comprising one or more blocking studs, the fan assembly comprising a housing having two flanges which are equipped with closure receptions and the fan assembly further comprising a fan mounted within said housing for rotation about an axis, and the closure receptions each having a blocking section into which the blocking stud can be swiveled, a plurality of locking pieces, with each of the plurality of locking pieces selectively immobilizing the fan assembly in an operating position of the fan assembly such that relative rotation between the air guidance housing and the fan assembly about the axis of the fan is blocked, wherein the fan assembly comprises two fixing sides, the fixing sides comprising the closure receptions with the blocking section and wherein the fan assembly can be selectively fixed at the air guidance housing by means of the fixing sides in operating positions rotated by 180 degrees, wherein the fan assembly, depending on a desired operation mode, sucking or blowing, is seated with the respective flange at its rear side on a bottom of the air guidance housing, so that the air guidance unit can be selectively converted from sucking to blowing operation and vice versa.

2. The air guidance unit of claim 1, wherein the fan assembly comprises a power connection, that the fan assembly can be fixed at the air guidance housing in several mounting positions and that the power connection is oriented in different allocations to the air guidance housing in different mounting positions.

3. The air guidance unit of claim 1, wherein the fan assembly comprises a circular flange which is inserted into a circular passage of the air guidance housing and centered therein and that the flange can be rotated in the passage to swivel the blocking stud into the blocking section.

4. The air guidance unit of claim 1, wherein the locking piece can be deflected against the biasing force of a spring when swiveling the fan assembly and that the locking piece snaps into a snap-lock for locking the fan assembly in the mounting position.

5. The air guidance unit of claim 1, wherein the locking piece can be moved, in the mounting position of the fan assembly, from its locking position into a release position by means of a release piece.

6. The air guidance unit of claim 1, wherein the air guidance housing comprises a continuous housing wall which is integrally connected with a bottom, that the bottom comprises the passage for air delivered by the fan assembly and that in the region of the housing wall at the outside thereof snap elements are provided for locking the air guidance housing in an opening of a wall element.

7. The air guidance unit of claim 1, wherein the air guidance housing carries hinge parts at a front side thereof to which an air guidance grating is pivotally hinged and that the air guidance grating can be swiveled between a mounting and a maintenance position, wherein it covers an air passage portion of the air guidance housing at the front thereof in the mounting position.

8. The air guidance unit of claim 1, wherein the locking stud is shaped like a knob and has a shaft carrying a head at a free end thereof and that the blocking section is formed as a slit-shaped receptacle receiving the shaft and being overlapped by the head.

9. The air guidance unit of claim 1, wherein the locking piece is integrally formed with the air guidance housing.

10. The air guidance unit of claim 1, wherein the fan housing is swiveled around the axis of rotation of the fan that it is included within the housing.

11. The air guidance unit of claim 1, wherein the two flanges of the housing are swiveled around the axis of rotation of the fan.

12. An air guidance unit for mounting into a cut-out of a switchgear cabinet wall, comprising an air guidance housing and a fan assembly that can be detachably connected thereto, the air guidance housing comprising one or more blocking studs, the fan assembly comprising a housing having two flanges which are equipped with closure receptions and the fan assembly further comprising a fan mounted within said housing for rotation about an axis, and the closure receptions each having a blocking section into which the blocking stud can be swiveled, a blocking element comprising a deflectable spring portion and a locking piece disposed at the end of the spring portion interacting with a release part of the fan assembly to selectively immobilize the fan assembly in an operating position of the fan assembly such that relative rotation between the air guidance housing and the fan assembly about the axis of the fan is blocked, wherein the fan assembly comprises two fixing sides, the fixing sides comprising the closure receptions with the blocking section and wherein the fan assembly can be selectively fixed at the air guidance housing by means of the fixing sides in operating positions rotated by 180 degrees, and wherein the fan assembly, depending on a desired operation mode, sucking or blowing, is seated with the respective flange at its rear side on a bottom of the air guidance housing, so that the air guidance unit can be selectively converted from sucking to blowing operation and vice versa.

* * * * *